(12) United States Patent
Tseng et al.

(10) Patent No.: US 8,160,339 B2
(45) Date of Patent: Apr. 17, 2012

(54) METHOD OF ANALYZING DIFFUSION-WEIGHTED MAGNETIC RESONANCE IMAGE

(75) Inventors: Isaac Wen-Yih Tseng, Taipei (TW); Fang-Cheng Yeh, Taipei (TW)

(73) Assignee: Isaac Wen-Yih Tseng, Taipei (TW)

( * ) Notice: Subject to any disclaimer, the term of this patent is extended or adjusted under 35 U.S.C. 154(b) by 878 days.

(21) Appl. No.: 12/170,386

(22) Filed: Jul. 9, 2008

(65) Prior Publication Data

US 2009/0016590 A1 Jan. 15, 2009

(30) Foreign Application Priority Data

Jul. 10, 2007 (TW) .............................. 96125046 A

(51) Int. Cl.
*G06K 9/00* (2006.01)
(52) U.S. Cl. ....................................................... 382/131
(58) Field of Classification Search .................. 382/128, 382/130–131
See application file for complete search history.

(56) References Cited

U.S. PATENT DOCUMENTS 7,711,171 B2 * 5/2010 Basser et al. .................. 382/131
2010/0135560 A1 * 6/2010 Embleton et al. ............. 382/128

OTHER PUBLICATIONS

F.C. Yeh, V.J. Wedeen, and W-Y. I. Tseng, A Recursive Algorithm to decompose orientation distribution function and resolve intra voxel fiber directions, Proc. Intl. Soc. Mag. Reson. Med. 16 (2008).*
Maxime Secoteaux, Rachid Derich, Alfred Anwander, Q-Ball imaging Tractography, INRIA Sophia Antipolis Aug. 2007.*

* cited by examiner

*Primary Examiner* — Christopher Mahoney
(74) *Attorney, Agent, or Firm* — Gregory & Sawrie LLP

(57) ABSTRACT

A method of analyzing a diffusion-weighted magnetic resonance image is adapted to analyze an orientation distribution function $\psi_0$ of nerve fibers at a vector in space. The method includes the following steps: (A) finding an orientation $\hat{\mu}_a$ with the largest probability in the ODF $\psi_0$; (B) maximizing a single fiber ODF $\psi'$; (C) analyzing the maximized single fiber ODF $\psi'$ to obtain quantitative information; (D) deducting the maximized single fiber ODF $\psi'$ obtained in step (B) from the entire ODF $\psi_0$; and (E) stopping computation if the result obtained in step (D) is determined to be smaller than a predetermined value, and repeating steps (A), (B), (C), and (D) if otherwise.

5 Claims, 3 Drawing Sheets

$\psi_0$  $\psi'$  $\psi_1$

METHOD OF ANALYZING DIFFUSION-WEIGHTED MAGNETIC RESONANCE IMAGE

CROSS-REFERENCE TO RELATED APPLICATION

This application claims priority of Taiwanese Application No. 096125046, filed on Jul. 10, 2007.

BACKGROUND OF THE INVENTION

1. Field of the Invention

The invention relates to a method of analyzing information, more particularly to a method of qualitatively and quantitatively analyzing a diffusion-weighted magnetic resonance image.

2. Description of the Related Art

Magnetic resonance imaging (MRI) is a non-invasive imaging method for examining organs and tissues of the human body. It works on the principle that magnetic fields can change the direction of magnetic spin of hydrogen atoms in a living body, and excite resonance of hydrogen atom nuclei, and it uses a computer to analyze electromagnetic signals to create images. Since about 70% of the human body is water ($H_2O$), which contains a large amount of hydrogen atom nuclei, MRI has been widely applied to clinical imaging.

Diffusion-weighted MR images (hereinafter referred to as DWI), which are capable of revealing detailed structures of tissue fibers, are realized through applying magnetic gradient pulses and receiving signals responding to diffusion of water molecules. Since diffusion of water molecules in tissues is mainly influenced by tissue structures, diffusion characteristics of water molecules can be used to estimate detailed structures of tissue fibers.

To analyze DWI, diffusion tensor imaging (DTI) techniques utilizing tensor analysis have been developed. Living organs are composed of non-homogeneous tissues, where the diffusion of water molecules exhibits an anisotropic pattern. Conventional diffusion coefficients can hardly reflect the diffusion characteristics of the water molecules clearly. Generally, magnetic gradients are applied in six specific directions to construct six diffusion-weighted images, along with one null image (imaging without magnetic gradient), which are analyzed to thereby obtain a tensor matrix. In DTI, a symmetric three-dimensional tensor matrix is used to describe the diffusion strength, and a tissue structure is inferred and constructed through eigen analysis.

A current method of improvement, known as high angular resolution diffusion imaging (HARDI), is to apply magnetic gradients in more directions during sampling. However, for the cerebral tissues of a human brain, the nerve fibers are largely intertwined, and it is difficult to discern the orientations of the fibers at fiber intersections. This manifests the fact that better analysis results cannot be obtained due to insufficient degree of freedom of the DTI matrix.

By further calculating HARDI information, an orientation distribution function (ODF) of a fiber at any one point in space can be obtained. However, techniques for qualitative and quantitative analysis of ODF are required if the number and orientations of the fibers also need to be known.

A current technical accomplishment is primarily concerned with finding local maximum values in ODFs to serve as orientations of the fibers. However, for ODFs at fiber intersections, if an included angle between two intersecting fibers is relatively small or if there are less branching fibers, such a method cannot be used to clearly analyze less conspicuous fibers. Therefore, with respect to qualitative and quantitative techniques for analyzing ODFs, further researches and developments are required.

SUMMARY OF THE INVENTION

Therefore, the object of the present invention is to provide a method of qualitatively and quantitatively analyzing diffusion-weighted magnetic resonance images in order to reveal intravoxel fibers.

Accordingly, a method of analyzing a diffusion-weighted magnetic resonance image is adapted to analyze an orientation distribution function (ODF) $\psi_0$ of a nerve fiber at a voxel, and comprises the following steps:

(A) finding an orientation $\hat{\mu}_a$ with the largest probability in the entire ODF $\psi_0$;

(B) finding a maximized single fiber ODF $\psi'$ along the orientation $\hat{\mu}_a$;

(C) analyzing the ODF $\psi'$ found in step (B) to obtain quantitative information;

(D) deducting the ODF $\psi'$ obtained in step (B) from the entire ODF $\psi_0$; and (E) stopping computation if the result obtained in step (D) is determined to be smaller than a predetermined value, and repeating steps (A), (B), (C), and (D) if otherwise.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 3:
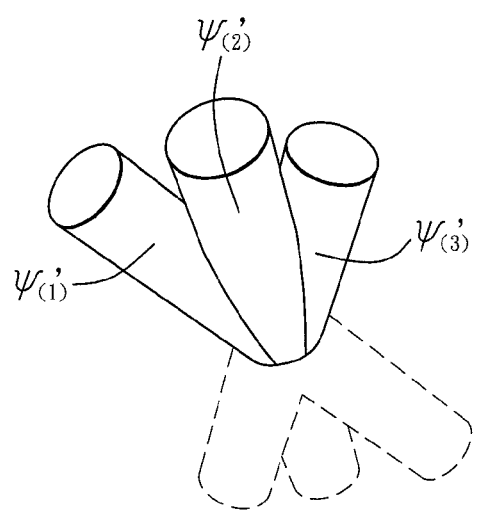
FIG. 3 is a schematic diagram depicting three fibers that can be resolved from the entire ODF $\psi_0$.
Figure 4:
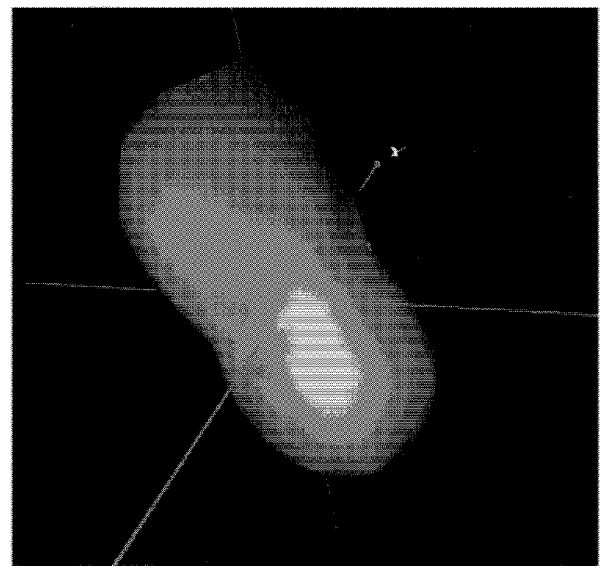
FIG. 4 illustrates the ODF found in a cortical spinal track.

Orientations of intersecting or crossing fibers in the DWI are difficult to be resolved. In the preferred embodiment, an ODF $\psi_0$ of a voxel in space is first obtained by analyzing high angular resolution diffusion images (HARDIs). The ODF $\psi_0$ will be such as that shown in FIG. 4 when presented in three dimensions. The purpose of analysis in this embodiment is to analyze the function $\psi_0$ of the voxel, and to resolve the orientation and strength of principal fibers, as well as the orientations and strengths of other fibers in descending order of principality (refer to FIG. 3).

Figure 1:
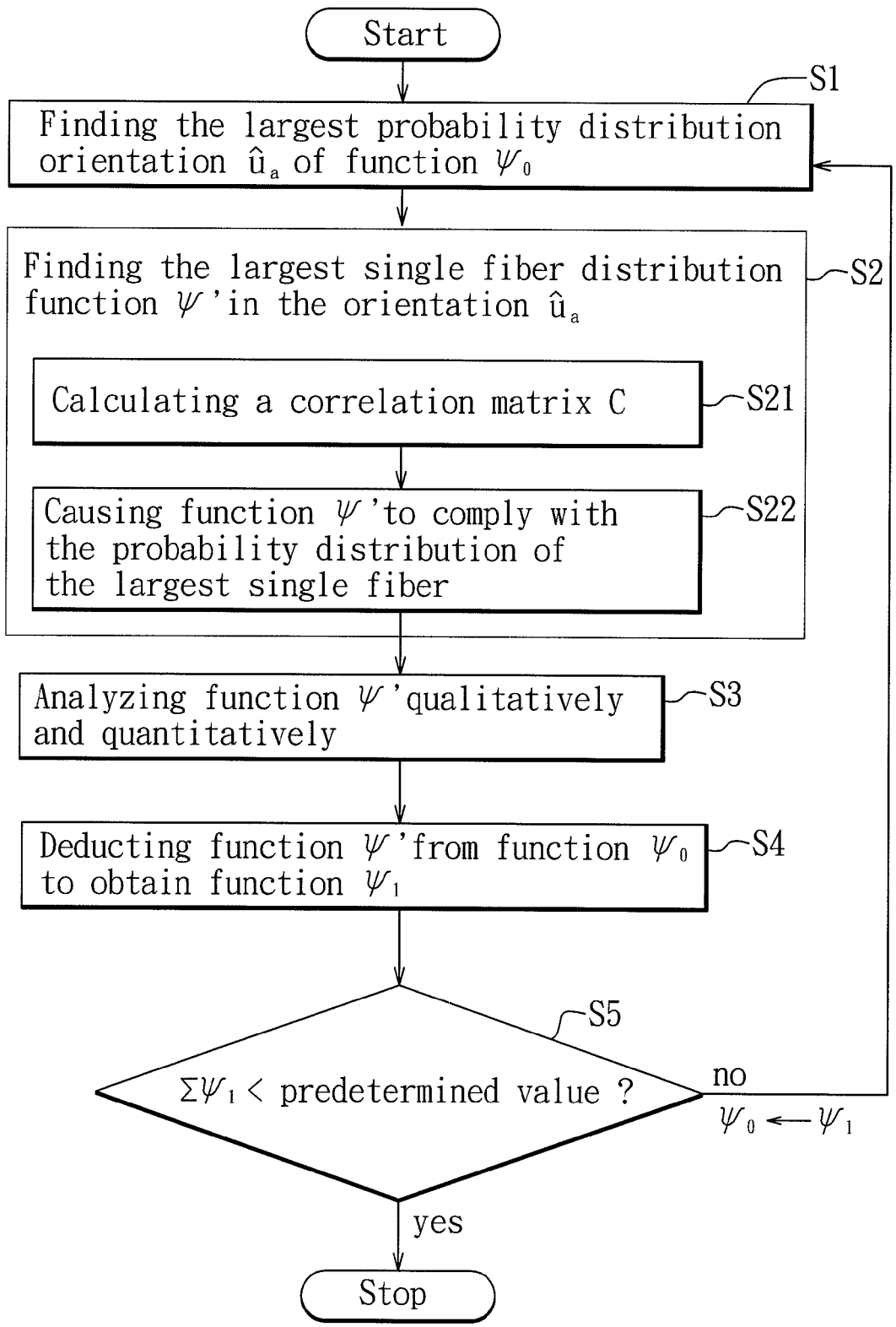
FIG. 1 is a flowchart of the preferred embodiment of a method of analyzing a diffusion-weighted magnetic resonance image according to the invention.

As shown in FIG. 1, the method according to this embodiment includes the following steps:

In step S1, a largest probability distribution orientation $\hat{\mu}_a$ of the entire ODF $\psi_0$ is found to serve as the orientation of the principal fiber, $\hat{\mu}_a = \arg\max \psi_0(\hat{\mu})$.

In step S2, a maximized single fiber distribution function $\psi'$ along the orientation $\hat{\mu}_a$ is found by analyzing the entire ODF $\psi'$ using the following steps:

In sub-step S21, a correlation between any two orientations $\hat{\mu}_i$, $\hat{\mu}_j$ is set to be an absolute value of a dot product (inner product) thereof, thereby obtaining a correlation matrix $$C=<C_{ij}>, c_{ij}=|\langle\hat{\mu}_i\cdot\hat{\mu}_j\rangle|.$$

Figure 2:
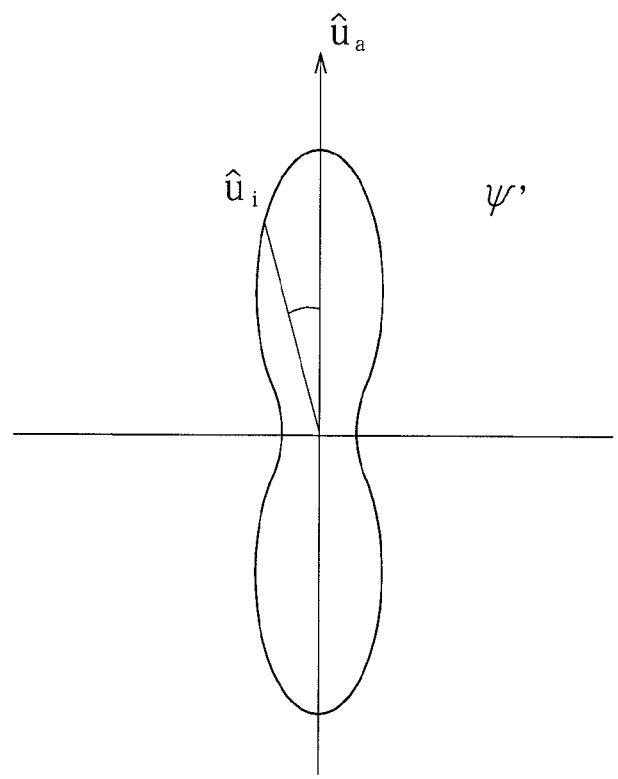
FIG. 2 is a schematic diagram showing a single fiber ODF $\psi'$.

In sub-step S22, referring to FIG. 2, with the maximum probability orientation being $\hat{\mu}_a$, the single fiber ODF $\psi'$ is maximized, which satisfies the following three conditions:

1. If $c_{ia}>c_{ja}$, then $\psi'(\hat{\mu}_i)>\psi'(\hat{\mu}_j)$. In other words, the larger the included angle, the smaller will be the correlation $C_{ai}$, and the distribution probability of the orientation $\hat{\mu}_i$.

2. If $c_{ia}=c_{ja}$, then $\psi'(\hat{\mu}_i)=\psi'(\hat{\mu}_j)$. In other words, since the single fiber distribution is axially symmetric, all orientations that form the same included angle with the orientation $\hat{\mu}_a$, i.e., orientations with equivalent correlations, should have equivalent distribution probabilities.

3. For any orientation $\hat{\mu}_i$, $\psi'(\hat{\mu}_i)\leq\psi_0(\hat{\mu}_i)$ has to be satisfied. That is, the distribution probability of the single fiber ODF $\psi'$ should not be greater than the probability of the entire ODF $\psi_0$.

In step S3, the maximized single fiber ODF $\psi'$ is further analyzed to obtain quantitative information. Content of the function $\psi'$ includes principal fiber orientations and probability information.

Figure 5:
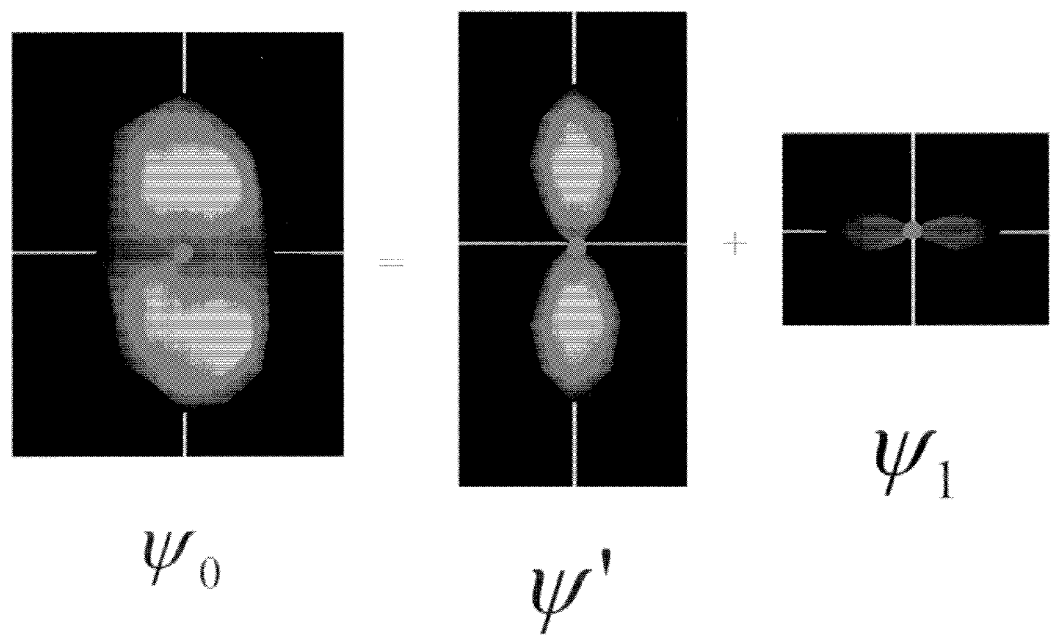
FIG. 5 illustrates exemplary analytical results of an ODF using the preferred embodiment.

In step S4, with reference to FIG. 5, the single fiber ODF $\psi'$ is deducted from the entire ODF $\psi_0$, i.e., the most evident fiber distribution is deducted therefrom to obtain the remaining ODF $\psi_1$.

In step S5, a determination is made as to whether sum of the remaining ODF $\psi_1$ is smaller than a predetermined value. In the negative, this indicates that there are remaining fibers, and $\psi_0$ is substituted by $\psi_1$ and steps S1 to S4 are repeated. In the affirmative, this indicates that there are no other fiber orientations with obvious distribution probability, and iterative computation should be stopped. For example, with reference to FIG. 5, supposing the total sum of an updated function $\psi_1$ obtained in step S4 during the third iterative computation is smaller than the predetermined value, this indicates that there is a negligible remainder after deducting various fiber ODFs sequentially from the entire ODF $\psi_0$. After several iterations, $\psi_0$ may have three sets of fibers $\psi'_{(1)}$, $\psi'_{(2)}$, $\psi'_{(3)}$ (see FIG. 3).

In the above embodiment, the method of this invention is exemplified by merely performing iterative computations of a voxel.

In sum, the method of analyzing diffusion-weighted magnetic resonance images according to the present invention exploits the anisotropic and asymmetric characteristics of ODFs to resolve crossing fibers. Thus, qualitative and quantitative analysis of ODFs can be accurately conducted.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A method of analyzing diffusion-weighted magnetic resonance images, said method being adapted to analyze an ODF $\psi_0$ of nerve fibers at a voxel in space, and comprising the following steps:
   (A) finding an orientation $\hat{\mu}_a$ with the largest probability in the ODF $\psi_0$;
   (B) maximizing a single fiber ODF $\psi'$;
   (C) analyzing the maximized single fiber ODF $\psi'$ to obtain quantitative information;
   (D) deducting the maximized single fiber ODF $\psi'$ obtained in step (B) from the entire ODF $\psi_0$; and
   (E) stopping computation if the result obtained in step (D) satisfies a termination condition, and substituting the result obtained in step (D) for the orientation distribution function $\psi_0$ in step (A), and repeating steps (A) to (D) if otherwise.

2. The method as claimed in claim 1, wherein, the distribution function $\psi'$ is found in step (B) using the following sub-steps: (B1) setting a correlation between any two orientations $\hat{\mu}_i$, $\hat{\mu}_j$ in space to be an absolute value of a dot product thereof so as to obtain a correlation matrix $C=<c_{ij}>$, $c_{ij}=|\langle\hat{\mu}_i\cdot\hat{\mu}_j\rangle|$; and (B2) finding a maximized single fiber ODF which satisfies the following three conditions: if $c_{ia}>c_{ja}$, then $\psi'(\hat{\mu}_i)>\psi'(\hat{\mu}_j)$; if $c_{ia}=c_{ja}$, then $\psi'(\hat{\mu}_i)=\psi'(\hat{\mu}_j)$; and for any orientation $\mu_i$, $\psi'(\hat{\mu}_i)\leq\psi_0(\hat{\mu}_i)$ has to be satisfied.

3. The method as claimed in claim 1, wherein steps (A) to (D) are repeated a number of times until the total sum of the remaining ODF of the result obtained in step (D) is smaller than a predetermined value.

4. The method as claimed in claim 1, wherein the orientation distribution function $\psi_0$ is obtained by analyzing high angular resolution diffusion-weighted images.

5. The method as claimed in claim 1, wherein the termination condition in step (E) is whether the result obtained in step (D) is smaller than a predetermined value, computation being stopped if the result is determined to be smaller than the predetermined value, steps (A), (B), (C), and (D) being repeated if otherwise.

* * * * *